United States Patent
Chan

(10) Patent No.: US 8,637,887 B2
(45) Date of Patent: Jan. 28, 2014

(54) THERMALLY ENHANCED SEMICONDUCTOR PACKAGES AND RELATED METHODS

(75) Inventor: Hsun-Wei Chan, Taoyuan (TW)

(73) Assignee: Advanced Semiconductor Engineering, Inc., Kaohsiung (TW)

(*) Notice: Subject to any disclaimer, the term of this patent is extended or adjusted under 35 U.S.C. 154(b) by 0 days.

(21) Appl. No.: 13/466,881

(22) Filed: May 8, 2012

(65) Prior Publication Data

US 2013/0299960 A1  Nov. 14, 2013

(51) Int. Cl.
*H01L 33/00* (2010.01)

(52) U.S. Cl.
USPC ........ 257/98; 257/99; 257/E33.059; 257/676; 257/675; 257/E33.061; 438/26; 438/29; 438/121; 438/122

(58) Field of Classification Search
USPC .............. 257/98, 99, 100, E33.059, 676, 675, 257/712, E33.061, E33.075; 438/26, 29, 438/121, 122
See application file for complete search history.

(56) References Cited

U.S. PATENT DOCUMENTS

| | | | |
|---|---|---|---|
| 6,534,330 B2 | 3/2003 | Sakamoto et al. | |
| 6,770,498 B2 | 8/2004 | Hsu | |
| 6,967,395 B1 | 11/2005 | Glenn et al. | |
| 6,995,510 B2 | 2/2006 | Murakami et al. | |
| 7,098,588 B2 | 8/2006 | Jäger et al. | |
| 7,128,442 B2 | 10/2006 | Lee et al. | |
| 7,297,293 B2 | 11/2007 | Tamaki et al. | |
| 7,372,198 B2 | 5/2008 | Negley | |
| 7,663,095 B2 | 2/2010 | Wong et al. | |
| 7,695,990 B2 | 4/2010 | Sorg et al. | |
| 8,044,420 B2 | 10/2011 | Lee et al. | |
| 2004/0084681 A1 | 5/2004 | Roberts | |
| 2005/0247944 A1 | 11/2005 | Haque et al. | |
| 2006/0118807 A1 | 6/2006 | Ives et al. | |
| 2008/0020517 A1* | 1/2008 | Kummerl et al. | 438/122 |
| 2008/0062701 A1 | 3/2008 | Harrah et al. | |
| 2008/0121921 A1 | 5/2008 | Loh et al. | |
| 2008/0194061 A1 | 8/2008 | Medendorp | |
| 2008/0217637 A1 | 9/2008 | Kim et al. | |
| 2009/0001869 A1 | 1/2009 | Tanimoto et al. | |
| 2010/0001306 A1* | 1/2010 | Park et al. | 257/99 |
| 2010/0270571 A1 | 10/2010 | Seo | |
| 2011/0073896 A1 | 3/2011 | Xu | |
| 2011/0278609 A1 | 11/2011 | Jeong et al. | |
| 2011/0278610 A1 | 11/2011 | Jeong et al. | |
| 2012/0286397 A1* | 11/2012 | Kuechenmeister et al. | 257/620 |

OTHER PUBLICATIONS

Feng et al.; "Packaging and AC Powering of LED Array", Electronic Components and Technology Conference (ECTC), 2010 Proceedings 60th, 512, (Jun. 2010).
Jordan et al.; "Optimized heat transfer and homogeneous color converting for ultra high brightness LED package," Proc. SPIE 6198, 61980B (2006).

* cited by examiner

*Primary Examiner* — Zandra Smith
*Assistant Examiner* — Paul Patton
(74) *Attorney, Agent, or Firm* — Klein, O'Neill & Singh, LLP

(57) ABSTRACT

A chip package having a lead frame and a molded portion. The lead frame includes a thermal pad and at least one electrode. The molded portion partially encapsulates the at least one electrode such that it is exposed on a top surface but not on a bottom surface. A bottom surface of the thermal pad is exposed for direct securement to an external heat sink. The molded portion is disposed between the at least one electrode and the heat sink to prevent a short circuit.

17 Claims, 7 Drawing Sheets

THERMALLY ENHANCED SEMICONDUCTOR PACKAGES AND RELATED METHODS

TECHNICAL FIELD

The present embodiments generally relate to semiconductor package structures, and in particular, to light-emitting diode (LED) package structures.

BACKGROUND

Light-emitting diode (LED) devices are preferred for many lighting applications due to the advantages they provide, such as low cost, low energy consumption, and related environmental benefits. A typical LED device includes at least one LED package containing an LED chip. LED device efficiency depends on not only LED chip quantum efficiency but also package design. An LED device generates heat during use that must be dissipated. Heat not only causes inefficiencies, but also influences long-term reliability of LED devices. Consequently, LED devices typically include a metal heat sink for better heat dissipation.

Some LED packages include a pre-molded lead frame, instead of a conventional ceramic substrate, to carry the LED chip. The pre-molded lead frame includes a pre-molded insulator encapsulating a lead frame having multiple electrodes and a thermal pad. The electrodes and thermal pad are exposed on a bottom of the LED package.

However, conventional LED packages cannot be directly surface-mounted to the electrically conductive surface of the metal heat sink, because the heat sink would short circuit the LED package's exposed electrodes. Typically, a printed circuit board provides an electrically insulative buffer between the conventional LED package and the heat sink to overcome this problem, but that solution significantly increases manufacturing costs. In addition, to reduce the thermal impedance between the LED package and the heat sink, the circuit board is often provided with thermal vias or metal inserts that extend through the circuit board. These features only further increase manufacturing costs.

Another LED package design, called a chip-on-board (COB) package, includes LED chips mounted on a metal-core printed circuit board (MCPCB). The MCPCB typically includes an aluminum plate with an insulating layer coated on its front surface and a copper pattern on the insulating layer that provides electrical routing and connection. The COB LED package can be directly surface-mounted to the electrically conductive surface of the metal heat sink. However, the heat transmission from the LED chip to the heat sink is significantly hindered by the insulating layer between the copper pattern and the aluminum core, which results in low thermal dissipation efficiency.

SUMMARY

One of the present embodiments comprises a chip package including a carrier having a thermal pad, a plurality of electrodes, and an insulator partially encapsulating the electrodes. The electrodes are exposed at a top surface of the carrier. A wall portion is disposed on and circumscribes the top surface of the carrier, forming a cavity. At least one chip is disposed on the thermal pad within the cavity. The chip is electrically connected to the exposed electrodes. An encapsulant is disposed within the cavity and encapsulates the at least one chip. A bottom surface of the thermal pad is exposed, but bottom surfaces of the electrodes are not exposed, such that the package may be mounted directly to an external device without short circuiting the electrodes.

Another of the present embodiments comprises a chip package including a thermal pad and a plurality of electrodes disposed about the thermal pad. An insulative package body partially encapsulates the electrodes. Top surfaces of the electrodes are exposed. The package body includes a wall portion circumscribing the thermal pad and forming a cavity. At least one chip is disposed on the thermal pad within the cavity. The chip is electrically connected to the exposed electrodes. A bottom surface of the thermal pad is coplanar with a bottom surface of the package body, such that the chip package may be mounted directly to an external device with the electrodes being spaced from the external device so as to prevent short circuiting of the electrodes.

Another of the present embodiments comprises a method for making a chip package. The method comprises providing a package substrate. The substrate comprises a lead frame having a thermal pad and an electrode. The substrate further comprises a molded portion coupled to the lead frame such that a bottom surface of the thermal pad is exposed from the molded portion, a top surface of the electrode is exposed from the molded portion, and a bottom surface and side surfaces of the electrode are completely covered by the molded portion, the molded portion further forming a cavity on an upper surface of the substrate. The method further comprises disposing a chip within the cavity and attached to an upper surface of the thermal pad and electrically connected to the electrode. The method further comprises disposing an encapsulant in the cavity and encapsulating the chip.

BRIEF DESCRIPTION OF THE DRAWINGS

Common reference numerals are used throughout the drawings and the detailed description to indicate the same elements. The present invention will be more apparent from the following detailed description taken in conjunction with the accompanying drawings.

DETAILED DESCRIPTION

Figure 1:
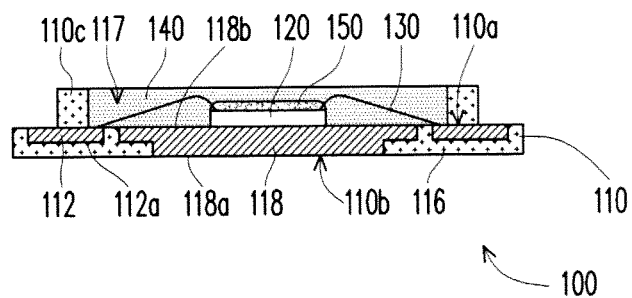
FIG. 1 is a cross-sectional side elevation view of a chip package according to one of the present embodiments.

Referring to FIG. 1, a chip package 100 according to one of the present embodiments is shown. The chip package 100 includes a carrier 110 and at least one chip 120 (for example a light-emitting diode (LED) chip) electrically connected to the carrier 110 by a plurality of wires 130. The carrier 110 may be, for example, pre-molded, but need not be. Although the chip 120 is identified herein as an LED chip, this reference is merely for convenience and not intended to be limiting. The present embodiments encompass any type of semiconductor chip package having a generally surface-mount lead configuration and substantially planar lower surface for contacting a heat sink.

The carrier 110 has at least two electrodes 112 (e.g. a positive electrode and a negative electrode), and an insulator 116 partially encapsulating the electrodes 112 and forming a package body, and a die pad or thermal pad 118. The insulator 116 may be, for example, pre-molded, but need not be. The electrodes 112 are exposed at a top surface 110a of the carrier 110 and spaced from the thermal pad 118. In the present embodiment, bottom surfaces 112a of the electrodes 112 are covered by the insulator 116, which is coplanar with a bottom surface 118a of the thermal pad to provide a planar bottom surface 110b of the carrier 110. The chip package 100 can thus be mounted directly to an external metal heat sink without short circuiting the electrodes 112, as further described below. Collectively, the electrodes 112 and the thermal pad 118 may be referred to as a lead frame.

The electrodes 112 may be metal, such as copper or aluminum. Surfaces of the electrodes 112 may be plated with a highly conductive metal coating, such as silver or gold. The insulator 116 may be a molding compound, such as, for example, a transparent or translucent polymer, a soft gel, an elastomer, a resin, an epoxy resin, a silicone, or an epoxy-silicone hybrid resin.

The thermal pad 118 carries the chip 120. Advantageously, a planar bottom surface 118a of the thermal pad 118 is exposed for dissipating heat directly from the chip 120 to the outside environment. In addition, the thermal pad 118 of the chip package 100 can be directly affixed to an external heat sink without short circuiting the electrodes 112, thereby further enhancing the thermal dissipation efficiency, as described further below with reference to FIG. 5.

The carrier 110 includes a vertical wall portion 110c disposed on and circumscribing an upper surface of the carrier 110. The wall portion 110c forms a cavity 117 in which the LED chip 120 and the wires 130 are disposed. The wall portion 110c comprises an insulative material, and may be formed integrally with the insulator 116 or formed separately. The wall portion 110c may be considered a part of the package body.

An encapsulant fills the cavity 117 and encapsulates the LED chip 120 and the wires 130. The encapsulant 140 may be made of a transparent polymer or a translucent polymer, for example, a soft gel, an elastomer, a resin, an epoxy resin, a silicone, or an epoxy-silicone hybrid resin. To improve the uniformity of light-emitting from the LED chip 120, the light may be scattered as it is emitted. Thus, scattering particles (not shown) may be added to the encapsulant 140. The scattering particles would randomly refract light as it passes through the encapsulant 140.

The LED chip 120 is disposed on an upper surface 118b of the thermal pad 118. The wires 130 extend between electrical contacts (e.g., anode and cathode) on the LED chip 120 and the electrodes 112 to electrically connect the LED chip 120 to the electrodes 112.

In the illustrated embodiment, a light converting layer 150 is disposed between the encapsulant 140 and the LED chip 120. The light converting layer 150 substantially covers an upper surface of the LED chip 120, and may also cover a portion of each wire 130. The light converting layer 150 includes particles of a light converting substance, such as, for example, fluorescent particles. Light, for example, blue light, emitted from the LED chip 120 may be converted by the light converting substance into light of different colors, such as, for example, green, yellow, and red, and the different colors may then be mixed to generate white light. In certain embodiments, the light converting layer 150 may not be provided. For example, the light converting layer 150 may not be required for a monochromatic LED package. In another of the present embodiments, the light converting layer 150 may be omitted and replaced by a light converting substance in the encapsulant 140.

Figure 2:
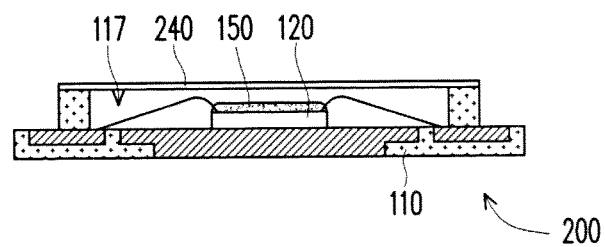
FIG. 2 is a cross-sectional side elevation view of a chip package according to another of the present embodiments.

FIG. 2 illustrates a chip package 200 according to another of the present embodiments. The chip package 200 is similar to the chip package 100 of FIG. 1. However, the encapsulant 140 of the chip package 100 is omitted and replaced with a lid or cover plate 240. The cover plate 240 is disposed over the carrier 110 for sealing the cavity 117. The cover plate 240 may be made of, for example, a glass, a transparent polymer, or a translucent polymer. To improve the uniformity of light-emitting from the LED chip 120, the light may be scattered as it is emitted. Thus, scattering particles (not shown) may be added to the cover plate 240. The scattering particles would randomly refract light as it passes through the cover plate 240. In addition, the light converting layer 150 may be omitted and replaced by a light converting substance in the cover plate 240.

Figure 3:
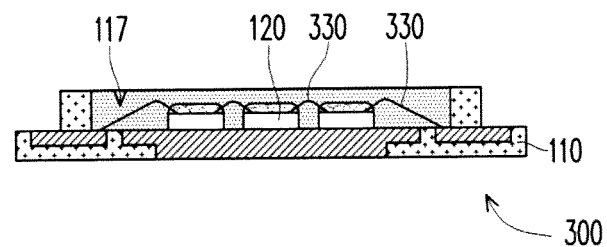
FIG. 3 is a cross-sectional side elevation view of a chip package according to another of the present embodiments.

FIG. 3 illustrates a LED package 300 according to yet another of the present embodiments. The chip package 300 is similar to the chip package 100 of FIG. 1. However, a plurality of chips 120 are mounted on the thermal pad 118 within the cavity 117 of the carrier 110. Wires 330 extend between the chips 120 and the electrodes 112 to electrically connect the chips 120 to the electrodes 112. The chips 120 may be low- or medium-power LED chips, which may provide better illumination for high-power lighting applications. In some embodiments, the chip package 300 may include a diode-protective chip, such as a Zener diode (not shown), to protect the chip 120 from excessive current. The Zener diode can adjust the working voltage, and functions to stabilize the circuit.

Figure 4:
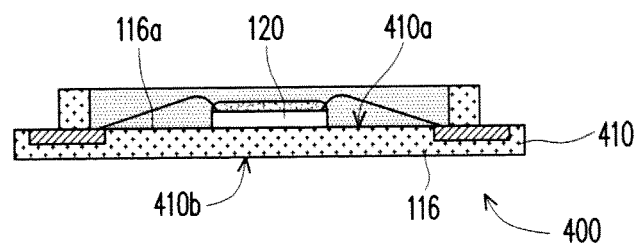
FIG. 4 is a cross-sectional side elevation view of a chip package according to another of the present embodiments.

FIG. 4 illustrates a chip package 400 according to yet another of the present embodiments. The chip package 400 is similar to the chip package 100 of FIG. 1. However, a carrier 410 does not include a thermal pad. In this embodiment, the LED chip 120 is disposed on an upper surface 116a of the insulator 116. The external heat sink may be attached to the bottom surface 410b of the chip package 400. In this embodiment, the insulator 116 is preferably made of one or more materials of high thermal conductivity and low water vapor permeability. In certain embodiments, the insulator 116 may be a molding compound containing thermally conductive filler material, e.g., alumina, magnesium oxide, beryllium oxide, aluminum nitride, boron nitride, silicon carbide, molybdenum carbide or titanium diboride.

Figure 5:
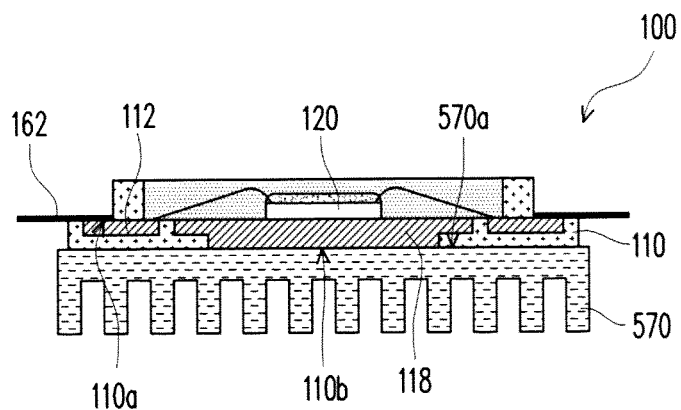
FIG. 5 is a cross-sectional side elevation view of the chip package of FIG. 1 mounted to a heat sink.

FIG. 5 illustrates the chip package 100 of FIG. 1 mounted to a heat sink 570. Advantageously, most of the heat generated by the chip 120 is directly transmitted to the heat sink 570 through the thermal pad 118, which provides excellent thermal conductivity. The main heat-transmitting path goes from the chip 120 to the thermal pad 118 to the heat sink 570. No insulating layer is located in the main heat-transmitting path, thereby providing excellent thermal dissipation efficiency. In certain embodiments, the bottom surface 110b of the carrier 110 may be securely attached to a bonding surface 570a of the heat sink 570 via a thermal grease, an adhesive tape, or a connector (not shown). The heat sink 570 may be sized and/or shaped to meet the needs of a given heat dissipation application, and the illustrated size and shape should not be interpreted as limiting.

As shown in FIG. 5, the chip package 100 is connected to external power supply circuitry by contacts 162, which are secured to exposed portions of the electrodes 112 on the top surface 110a of the carrier 110. The external power supply circuitry delivers current to the chip package 100 so that the LED chip 120 may generate light.

Figure 6A:
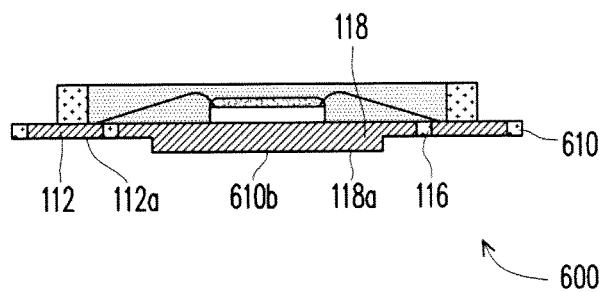
FIG. 6A is a cross-sectional side elevation view of a chip package according to another of the present embodiments.

FIG. 6A illustrates a chip package 600 according to yet another of the present embodiments. The chip package 600 is similar to the chip package 100 of FIG. 1. However, the carrier 110 is omitted and replaced with a carrier 610 in which the insulator 116 does not cover the bottom surfaces 112a of the electrodes 112. With this configuration, during a pre-mold process of forming the carrier 610, the electrodes 112 can be directly supported by a bottom mold, thereby preventing mold flash. The electrodes 112 are spaced from a bottom surface 610b of the carrier 610, so that the chip package 600 is adapted to be mounted directly to an external heat sink, with the heat sink contacting a bottom surface 118a of the thermal pad 118, but being spaced from the electrodes 112.

Figure 6B:
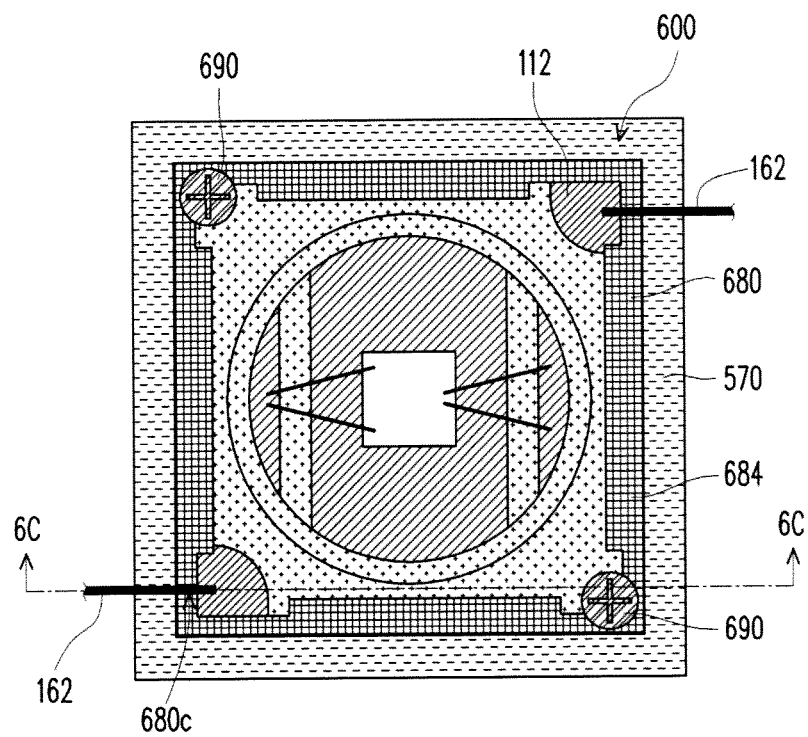
FIG. 6B is a top plan view of the chip package of FIG. 6A mounted to a heat sink via a connector made of insulating material.
Figure 6C:
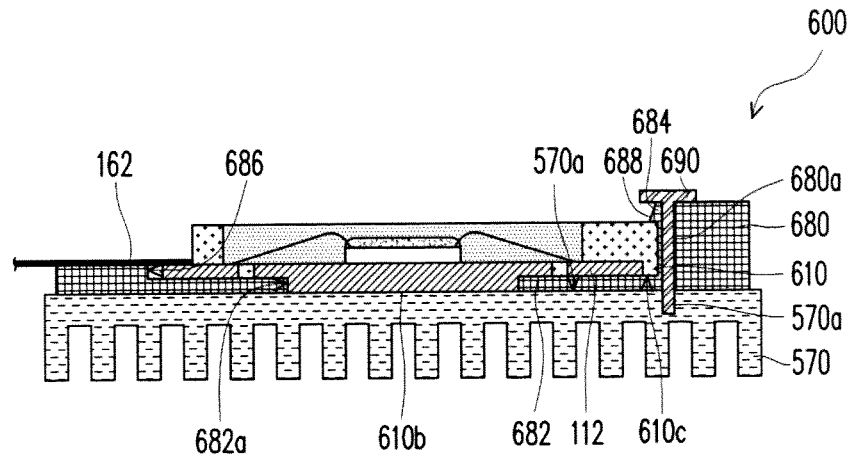
FIG. 6C is a cross-sectional view taken along line 6C-6C of FIG. 6B.

FIGS. 6B and 6C illustrate the chip package 600 of FIG. 6A mounted to a heat sink 570 via a connector 680 made of insulating material. The connector 680 has a bottom lip portion 682, a top lip portion 684, and a groove 686 defined by the lips 682, 684. The bottom lip portion 682 is located between the electrodes 112 of the carrier 610 and the bonding surface 570a of the heat sink 570, thereby allowing the chip package 600 to be mounted directly to the heat sink 570 without short circuiting the electrodes 112. The bottom lip portion 682 has a recess 682a that receives a lower portion of the thermal pad 118 to allow the bottom surface 610b of the carrier 610 to directly contact the heat sink 570. The groove 686 is configured to receive the peripheral portion 610c of the carrier 610. In a process for assembling the package 600 with the connector 680, the peripheral portion 610c of the carrier 610 is clipped into the groove 686. As in the embodiment of FIG. 5, the chip package 600 is connected to external power supply circuitry by contacts 162, which are secured to exposed portions of the electrodes 112. Since the contacts 162 are secured to the package 600 before the package 600 is assembled with the connector 680, the connector 680 has gaps 680c (FIG. 6B) for receiving the contacts 162.

Referring to FIGS. 6B and 6C, two fasteners 690 are received within openings 680a, 570a in the connector 680 and the heat sink 570, respectively, to secure the chip package 600 to the heat sink 570. The fasteners 690 and the openings in the heat sink 570 may be threaded. The connector 680 may be made of an elastomer, such as rubber, or other buffering materials that are capable of absorbing external impact. Optionally, an upper edge 688 of an inner circumferential portion of the connector 680 may be beveled as shown, which facilitates installing the chip package 600 into the connector 680.

Figure 7A:
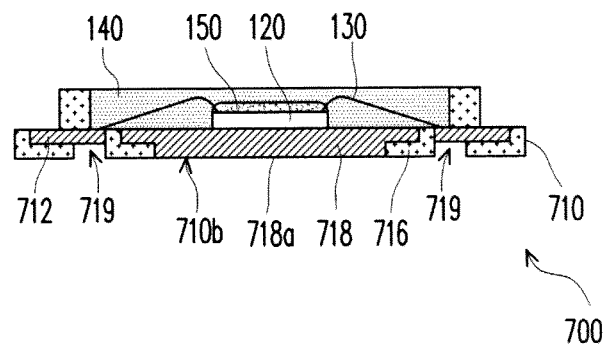
FIG. 7A is a cross-sectional side elevation view of a chip package according to another of the present embodiments.

FIG. 7A illustrates a chip package 700 according to yet another of the present embodiments. The chip package 700 is similar to the chip package 100 of FIG. 1. However, the carrier 110 is omitted and replaced by a carrier 710 having openings 719, which are formed by removing portions of the insulator 716 beneath each of the electrodes 712. Thus, the electrodes 712, while partially exposed, are nonetheless spaced from the bottom surface 710b of the carrier 710 so that the package 700 is adapted to be mounted directly to an external heat sink, with the heat sink contacting a bottom surface 718a of the thermal pad 718, but being spaced from the electrodes 112.

Figure 7B:
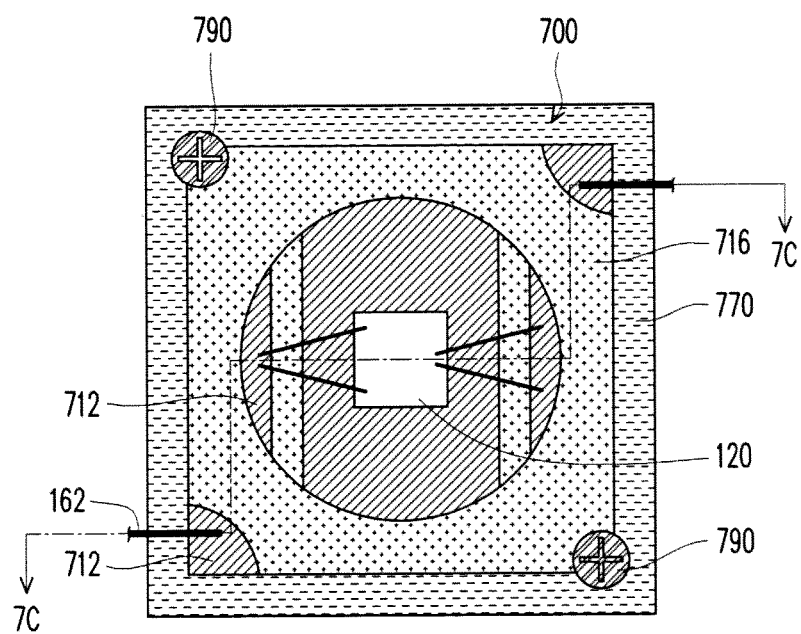
FIG. 7B is a top plan view of the chip package of FIG. 7A mounted to a heat sink by fasteners and an insulating thermal grease located between the chip package and the heat sink.
Figure 7C:
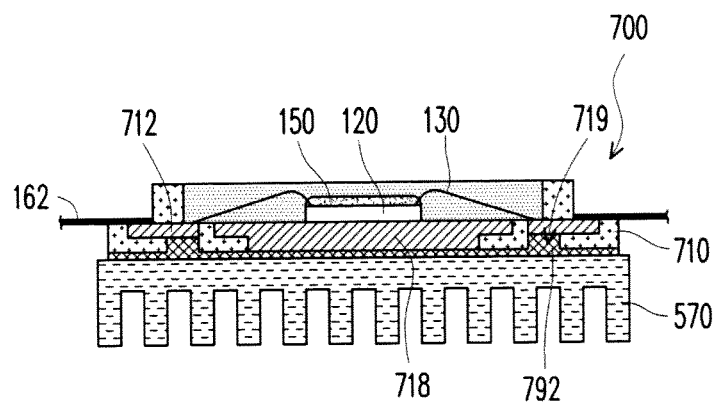
FIG. 7C is a cross-sectional view taken along line 7C-7C of FIG. 7B.

FIGS. 7B and 7C illustrate the chip package 700 of FIG. 7A mounted to a heat sink 570 by fasteners, such as screws 790. With reference to FIG. 7B, an insulating thermal grease 792 (or an insulating adhesive tape or the like) is located between the chip package 700 and the heat sink 570. The insulating thermal grease 792 fills in the openings 719 beneath the electrodes 712, thereby further decreasing the likelihood of a short circuit between the electrodes 112. In addition, the thermal grease 792 can enhance the thermal dissipation efficiency from the chip package 700 to the heat sink 570. As in the embodiments of FIGS. 5 and 6, the chip package 700 is connected to external power supply circuitry by contacts 162, which are secured to exposed portions of the electrodes 712.

Figure 8:
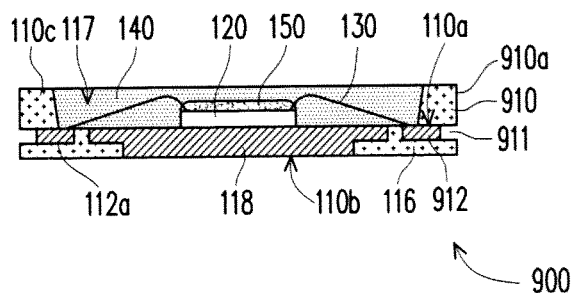
FIG. 8 is a cross-sectional side elevation view of a chip package according to another of the present embodiments.
Figure 9A:
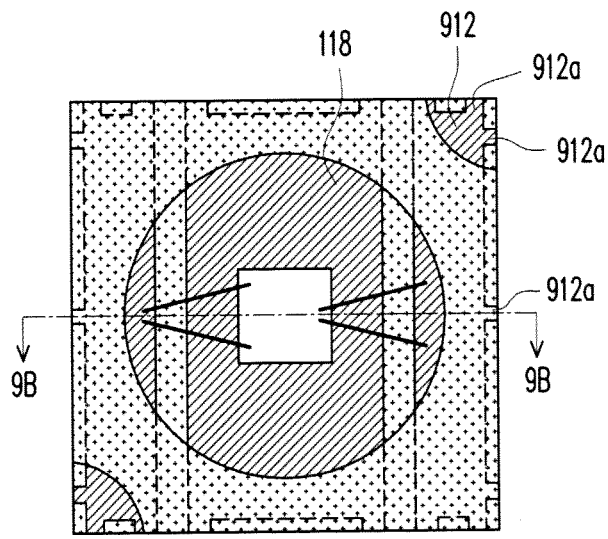
FIG. 9A is a top plan view of a chip package according to another of the present embodiments.
Figure 9B:
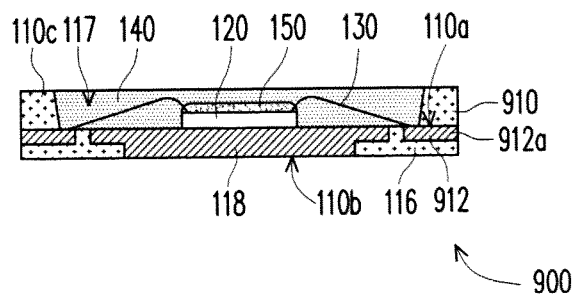
FIG. 9B is a cross-sectional view taken along line 9B-9B of the chip package of FIG. 9A.

FIG. 8 illustrates a chip package 900 according to yet another of the present embodiments. The chip package 900 is similar to the chip package 100 of FIG. 1. However, the carrier 110 is omitted and replaced by a carrier 910 having recesses 911, which are formed by removing lateral portions 912a (FIGS. 9A and 9B) of the electrodes 912 such that the electrodes 912 are recessed from a lateral surface 910a of the carrier 910. In certain embodiments, the recesses 911 have a depth (the distance from the lead 912 to the side surface 910a of the pre-molded carrier 910) of at least 0.15 mm, thereby significantly reducing the chances of short circuiting occurring between the electrodes 912, as further discussed below. FIG. 9A illustrates the chip package 900 with the lateral portions 912a. During manufacture, the electrodes 912 are connected to an adjacent lead frame unit by the lateral portions 912a, which form exposed lateral surfaces after a singulation step. Since the exposed lateral portions 912a are very close to conductive surfaces of the external heat sink, they may cause short circuiting between the electrodes 912 after the chip package 900 is mounted to the heat sink. Thus, the chip package 900 of FIG. 8 removes the lateral portions 912a.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not necessarily be drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention.

Accordingly, unless specifically indicated herein, the order and grouping of the operations are not limitations of the invention.

What is claimed is:

1. A chip package, comprising: a carrier including a thermal pad, a plurality of electrodes, and an insulator partially encapsulating the electrodes, wherein the electrodes are exposed at a top surface of the carrier; a wall portion disposed on and circumscribing the top surface of the carrier, the wall portion forming a cavity; at least one chip disposed on the thermal pad within the cavity, the chip being electrically connected to the exposed top surfaces of the electrodes; and an encapsulant disposed within the cavity and encapsulating the at least one chip; wherein a bottom surface of the thermal pad is exposed but bottom surfaces of the electrodes are not exposed, such that the package may be mounted directly to an external device without short circuiting the electrodes; and wherein each of the electrodes is recessed from a lateral surface of the carrier to thereby form a cavity in the lateral surface of the carrier.

2. The chip package of claim 1, wherein a bottom surface of each of the electrodes is covered by the insulator.

3. The chip package of claim 2, wherein a bottom surface of the thermal pad is coplanar with a bottom surface of the insulator.

4. The chip package of claim 1, further comprising an external heat sink mounted directly to the bottom surface of the thermal pad.

5. The chip package of claim 4, wherein the insulator is disposed between the electrodes and the heat sink.

6. The chip package of claim 4, wherein the insulator includes an opening beneath each of the electrodes such that at least a portion of a bottom surface of each of the electrodes is exposed.

7. The chip package of claim 6, further comprising a thermal grease or an adhesive tape disposed between the electrodes and the heat sink in the areas of the openings.

8. A chip package, comprising a thermal pad; a plurality of electrodes disposed about the thermal pad; an insulative package body partially encapsulating the electrodes, wherein top surfaces of the electrodes are exposed, the package body including a wall portion circumscribing the thermal pad and forming a cavity; and at least one chip disposed on the thermal pad within the cavity, the chip being electrically connected to the exposed top surfaces of the electrodes; wherein a bottom surface of the thermal pad is coplanar with a bottom surface of the package body, such that the chip package may be mounted directly to an external device with the electrodes being spaced from the external device so as to prevent short circuiting of the electrodes: and wherein each of the electrodes is recessed from a lateral surface of the package body to thereby form a cavity in the lateral surface of the carrier.

9. The chip package of claim 8, further comprising an encapsulant disposed within the cavity and encapsulating the at least one chip.

10. The chip package of claim 8, further comprising a cover plate disposed over the wall portion and sealing the cavity.

11. The chip package of claim 8, wherein a bottom surface of each of the electrodes is covered by the insulator.

12. The chip package of claim 8, further comprising an external heat sink mounted directly to the bottom surface of the thermal pad.

13. The chip package of claim 12, wherein the insulator is disposed between the electrodes and the heat sink.

14. The chip package of claim 12, wherein the insulator includes an opening beneath each of the electrodes such that at least a portion of a bottom surface of each of the electrodes is exposed.

15. The chip package of claim 14, further comprising a thermal grease or an adhesive tape disposed between the electrodes and the heat sink in the areas of the openings.

16. A method for making a chip package, the method comprising providing a package substrate, the substrate comprising a lead frame having a thermal pad and an electrode; and a molded portion coupled to the lead frame such that a bottom surface of the thermal pad is exposed from the molded portion, a top surface of the electrode is exposed from the molded portion, and a bottom surface and side surfaces of the electrode are completely covered by the molded portion, the molded portion further forming a cavity on an upper surface of the substrate; disposing a chip within the cavity and attached to an upper surface of the thermal pad and electrically connected to the exposed top surface of the electrode; disposing an encapsulant in the cavity and encapsulating the chip; wherein the electrode is recessed from a lateral surface of the molded portion to thereby form a cavity in the lateral surface of the carrier.

17. The method of claim 16, further comprising securing a heat sink to the substrate such that the bottom surface of the thermal pad directly contacts the heat sink and the molded portion is disposed between the electrode and the heat sink.

* * * * *